(12) United States Patent
Matsuzaki

(10) Patent No.: US 12,199,009 B2
(45) Date of Patent: Jan. 14, 2025

(54) ELECTRONIC APPARATUS

(71) Applicant: KIOXIA CORPORATION, Tokyo (JP)

(72) Inventor: Kazuyuki Matsuzaki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 16 days.

(21) Appl. No.: 17/900,051

(22) Filed: Aug. 31, 2022

(65) Prior Publication Data

US 2023/0307315 A1    Sep. 28, 2023

(30) Foreign Application Priority Data

Mar. 22, 2022    (JP) ................. 2022-045863

(51) Int. Cl.
G06F 1/18         (2006.01)
H01L 23/40        (2006.01)
H05K 1/02         (2006.01)

(52) U.S. Cl.
CPC .......... *H01L 23/4093* (2013.01); *G06F 1/184* (2013.01); *G06F 1/185* (2013.01); *H01L 23/4006* (2013.01); *H05K 1/0271* (2013.01)

(58) Field of Classification Search
CPC ........................................... G06F 1/18
See application file for complete search history.

(56) References Cited

U.S. PATENT DOCUMENTS

| 7,839,643 | B1 | 11/2010 | Yu | |
| 10,120,424 | B2* | 11/2018 | Kim, II | H05K 1/0271 |
| 2019/0200446 | A1* | 6/2019 | Long | H05K 1/021 |
| 2020/0235025 | A1* | 7/2020 | Shimizu | H05K 5/0217 |

FOREIGN PATENT DOCUMENTS

JP    2007-183746 A    7/2007

\* cited by examiner

*Primary Examiner* — Jerry Wu
(74) *Attorney, Agent, or Firm* — Kim & Stewart LLP

(57) ABSTRACT

An electronic apparatus includes a first substrate, a second substrate, and an elastic member. The first substrate has a first surface on which a metal member is provided. The second substrate is coupled to the first substrate above the first surface and on which a plurality of electronic components is mounted. The second substrate has a second surface that faces away from the first surface. The elastic member has an inner surface that contacts the second surface or at least one of the electronic components and an outer surface that faces the first surface and is in thermal contact with the metal member.

20 Claims, 5 Drawing Sheets

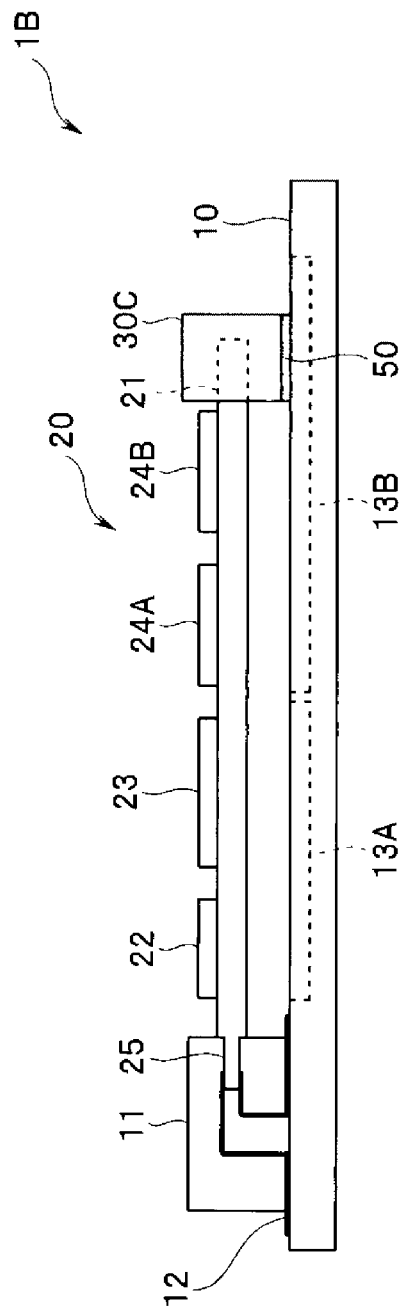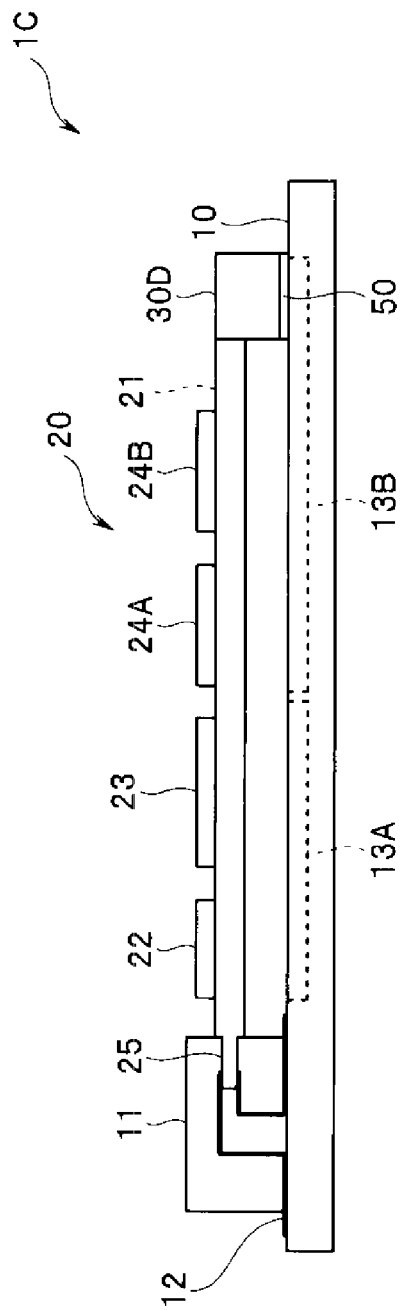

ELECTRONIC APPARATUS

CROSS-REFERENCE TO RELATED APPLICATION(S)

This application is based upon and claims the benefit of priority from Japanese Patent Application No. 2022-045863, filed Mar. 22, 2022, the entire contents of which are incorporated herein by reference.

FIELD

Embodiments described herein relate generally to an electronic apparatus.

BACKGROUND

An electronic apparatus including an SSD (Solid State Drive) module attached to a socket on a mother board therein is known. The SSD is attached to the socket and also fixed to the mother board using a screw or a stud. In the electronic apparatus, a vibration resistance and an impact resistance are desirable in attaching and fixing the SSD to the mother board. In addition, since the SSD generates heat during its operation, efficient dissipation of the heat generated by the SSD is also desirable.

BRIEF DESCRIPTION OF THE DRAWINGS

FIG. 7 is a side view diagram illustrating an example of a configuration of an electronic apparatus according to a first modification of the second embodiment.

FIG. 8 is a side view diagram illustrating an example of a configuration of an electronic apparatus according to a second modification of the second embodiment.

DETAILED DESCRIPTION

Embodiments provide an electronic apparatus capable with improved heat dissipation, a vibration resistance, and an impact resistance.

In general, according to an embodiment, an electronic apparatus includes a first substrate, a second substrate, and an elastic member. The first substrate has a first surface on which a metal member is provided. The second substrate is coupled to the first substrate above the first surface and on which a plurality of electronic components is mounted. The second substrate has a second surface that faces away from the first surface. The elastic member has an inner surface that contacts the second surface or at least one of the electronic components and an outer surface that faces the first surface and is in thermal contact with the metal member.

Hereinafter, embodiments will be described with reference to the drawings.

First Embodiment

Figure 1:
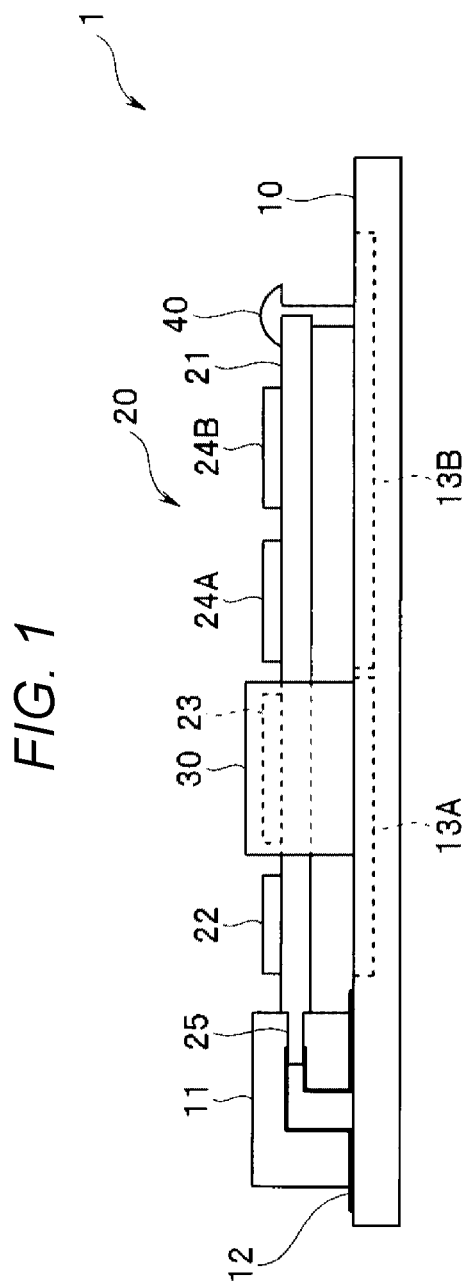
FIG. 1 is a side view diagram illustrating an example of a configuration of an electronic apparatus according to a first embodiment.
Figure 2:
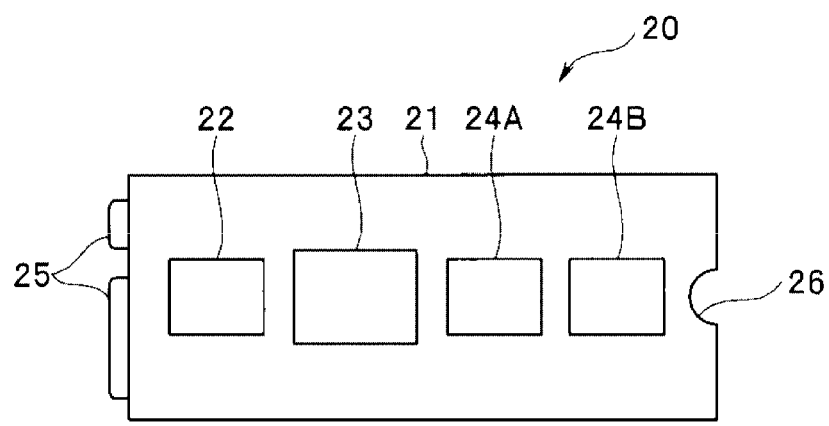
FIG. 2 is a plan view diagram illustrating an example of a configuration of an SSD module in the first embodiment.
Figure 3:
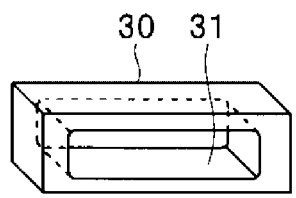
FIG. 3 is a perspective view diagram illustrating an example of a configuration of a heat dissipation rubber in the first embodiment.

An electronic apparatus according to a first embodiment will be described with reference to FIGS. 1 to 3. FIG. 1 is a side view diagram illustrating an example of a configuration of the electronic apparatus according to the first embodiment. FIG. 2 is a plan view diagram illustrating an example of a configuration of an SSD module in the first embodiment. As illustrated in FIG. 1, an electronic apparatus 1 includes a mother board 10, an SSD module 20, and a heat dissipation rubber 30.

The mother board 10 is an example of a first substrate. A socket 11 is mounted on the mother board 10. The socket 11 is configured such that a connector 25 of the SSD module 20 is inserted into the socket 11. When the connector 25 of the SSD module 20 is inserted into the socket 11, a wiring of the connector 25 of the SSD module 20 is electrically connected to a wiring 12 of the mother board 10 via an internal wiring of the socket 11. Furthermore, the mother board 10 includes grounds 13A and 13B formed of metal such as copper. The grounds 13A and 13B are interconnections to have a reference potential when electronic components, not illustrated, mounted on the mother board 10 operate. The grounds 13A and 13B are electrically connected to a ground of the SSD module 20 via the connector 25 and the socket 11. The socket 11 is an example of a connection component.

The SSD module 20 includes a substrate 21, a DRAM 22, an SSD controller 23, two NAND flash memory chips 24A and 24B, the connector 25, and a screw clamp 26 (refer to FIG. 2). The DRAM 22, the SSD controller 23, and the NAND flash memory chips 24A and 24B are packaged devices each having a semiconductor chip encapsulated with a sealing material and mounted on the substrate 21. The substrate 21 is an example of a second substrate. The DRAM 22, the SSD controller 23, and the NAND flash memory chips 24A and 24B are an example of electronic components.

The DRAM 22 is a volatile memory that can temporarily store data. While the SSD module 20 uses the DRAM 22 as the volatile memory, the volatile memory is not limited to the DRAM and may be, for example, an SRAM. The DRAM 22 may or may not be built in the SSD controller 23.

The NAND flash memory chips 24A and 24B are nonvolatile memory chips capable of storing data in a nonvolatile manner. While the SSD module 20 includes the two NAND flash memory chips 24A and 24B, the number of NAND flash memory chips is not limited to two and the SSD module 20 may include either one NAND flash memory chip or three or more NAND flash memory chips.

The SSD controller 23 controls writing and reading of data to and from the NAND flash memory chips 24A and 24B, and the like in response to a request from an external host. The SSD controller 23 uses the DRAM 22 for controlling these operations. The external host is, for example, a processor (an example of the electronic components) mounted on the mother board 10.

The connector 25 is provided in one end portion of the substrate 21. The connector 25 is configured to be inserted into the socket 11 of the mother board 10. Part of the electronic components mounted on the SSD module 20 are electrically connected to the wiring 12 of the mother board 10.

The screw clamp 26 is provided in an opposite end portion to the one end portion of the substrate 21. The screw clamp 26 has a semicircular shape and thus may be referred as a notch. An external shape of the screw clamp 26 may be a circular arc or polygonal shape. In the following description, a direction in which the connector 25 of the substrate 21 is provided may be referred to as "tip end side" and a direction in which the screw clamp 26 of the substrate 21 is provided may be referred to as "base end side". The screw clamp 26 is an example of an attachment.

As illustrated in FIG. 1, the screw clamp 26 is screwed to the mother board 10 by a screw 40. The SSD module 20 is thereby fixed to the mother board 10. Furthermore, the screw 40 is connected to the ground 13B of the mother board 10. The screw 40 is thermally conductive. That is, the screw 40 has a fixing function to fix the SSD module 20 to the mother board 10, and a heat dissipation function to dissipate heat of the substrate 21 to the ground 13B. The screw 40 is an example of a fixing member.

The heat dissipation rubber 30 has higher thermal conductivity than thermal conductivities of normal plastic resin and rubber. The thermal conductivity of the heat dissipation rubber 30 is, for example, 2 to 5 W/mk. The heat dissipation rubber 30 is an example of an elastic member.

A configuration of the heat dissipation rubber 30 will be described with reference to FIG. 3. FIG. 3 is a perspective view diagram illustrating an example of the configuration of the heat dissipation rubber in the first embodiment. As illustrated in FIG. 3, the heat dissipation rubber 30 includes a through-hole 31 that passes through the heat dissipation rubber 30 from one side surface to the other side surface located opposite to the one side surface. The SSD module 20 is inserted into this through-hole 31 and the heat dissipation rubber 30 is disposed at a position at which the heat dissipation rubber 30 covers the SSD controller 23.

The electronic components mounted on the SSD module 20 generate heat during an operation of the SSD module 20. Heat generation by the SSD controller 23 is the highest in calorific value among the electronic components mounted on the SSD module 20, and peripheral components such as the NAND flash memory chips 24A and 24B of the SSD module 20 are susceptible to an influence of the heat. In an implementation, to address this issue, the heat dissipation rubber 30 covers the SSD controller 23. More specifically, the heat dissipation rubber 30 has a first surface (may be referred to as an inner surface) that forms part of the through-hole 31 and is disposed so that the first surface contacts the SSD controller 23.

Moreover, the heat dissipation rubber 30 has a second surface (may be referred to as an outer surface or a bottom surface) that forms part of an external surface of the heat dissipation rubber 30. With the connector 25 of the SSD module 20 inserted into the socket 11 and with the SSD module 20 fixed to the mother board 10, the second surface of the heat dissipation rubber 30 is in thermal contact (e.g., direct contact) with the ground 13A of the mother board 10. This configuration enables efficient dissipation of the heat generated by the SSD controller 23 to the mother board 10, so that the peripheral components of the SSD module 20 are less susceptible to the heat.

After the heat dissipation rubber 30 is disposed at the position at which the heat dissipation rubber 30 covers the SSD controller 23, the connector 25 on the tip end side is inserted into the socket 11 of the mother board 10 and the screw clamp 26 on the base end side is screwed by the screw 40. The electronic apparatus 1 illustrated in FIG. 1 is thus assembled. It is noted that the electronic apparatus 1 may be assembled by inserting the heat dissipation rubber 30 from the base end side of the SSD module 20 and screwing the screw clamp 26 on the base end side by the screw 40 after the connector 25 is inserted into the socket 11.

As described above, since the heat dissipation rubber 30 is in contact with the SSD controller 23 and the ground 13A of the mother board 10, the heat generated by the SSD controller 23 dissipates to the mother board 10. Furthermore, since the elastic heat dissipation rubber 30 covers the SSD controller 23, so that a vibration resistance and an impact resistance of the electronic apparatus 1 are improved.

The electronic apparatus 1 according to the present embodiment is, therefore, capable of improving heat dissipation, the vibration resistance, and the impact resistance.

Modification

Figure 4:
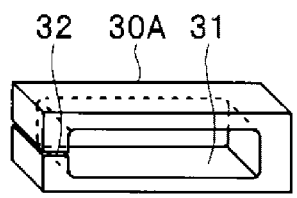
FIG. 4 is a perspective view diagram illustrating an example of a configuration of a heat dissipation rubber according to a modification of the first embodiment.

FIG. 4 is a perspective view diagram illustrating an example of a configuration of a heat dissipation rubber according to a modification of the first embodiment.

A slit 32 that reaches the through-hole 31 from one end surface (e.g., a side surface facing a side edge of the substrate 21) is formed in a heat dissipation rubber 30A in the modification of the first embodiment. Deforming the heat dissipation rubber 30A so that this slit 32 can be opened enables the SSD module 20 to be attached to or detached from the heat dissipation rubber 30A.

For example, in the embodiment described above, it is impossible to attach the heat dissipation rubber 30 after the SSD module 20 is inserted into the socket 11 of the mother board 10 via the connector 25 and fixed to the mother board 10 with the screw 40. Furthermore, when the heat dissipation rubber 30 is to be detached after the SSD module 20 is inserted into the socket 11 via the connector 25 and fixed to the mother board 10 with the screw 40, it is impossible to detach the heat dissipation rubber 30 without detaching at least the screw 40.

In contrast, the heat dissipation rubber 30A in the modification has the slit 32, and, therefore, can be freely attached or detached even after the SSD module 20 is inserted into the socket 11 via the connector 25 and fixed to the mother board 10 with the screw 40. As a result, it is possible to improve attachability and detachability of the heat dissipation rubber 30A to and from the SSD module 20.

Second Embodiment

Next, a second embodiment will be described.

In the first embodiment, the screw 40 is used when the SSD module 20 is fixed to the mother board 10. With these configurations, positional variations related to a screwing process may cause damage to the peripheral components, e.g., the NAND flash memory chip 24B, of the screw clamp 26, via the screw 40. In addition, when the SSD module 20 is fixed to the mother board 10 using the screw 40 having relatively high hardness, the vibration resistance and the impact resistance are reduced. To address such a problem, the second embodiment is directed to fixing the SSD module 20 to the mother board 10 without the screw 40.

Figure 5:
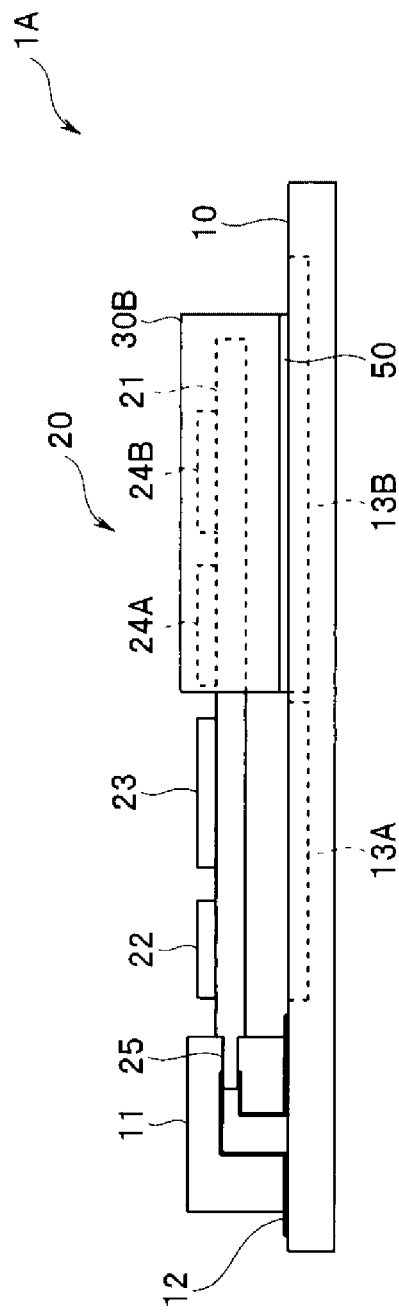
FIG. 5 is a side view diagram illustrating an example of a configuration of an electronic apparatus according to a second embodiment.
Figure 6:
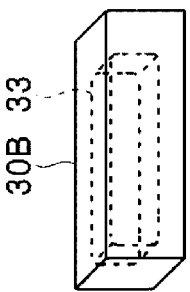
FIG. 6 is a perspective view diagram illustrating an example of a configuration of a heat dissipation rubber in the second embodiment.

FIG. 5 is a side view diagram illustrating an example of a configuration of an electronic apparatus according to the second embodiment. FIG. 6 is a perspective view diagram illustrating an example of a configuration of a heat dissipation rubber used in the second embodiment. In FIG. 5, the same configurations as those in FIG. 1 are denoted by the same reference signs and not described repeatedly.

As illustrated in FIG. 5, an electronic apparatus 1A according to the second embodiment has a heat dissipation rubber 30B as an alternative to the heat dissipation rubber 30 in the first embodiment. The heat dissipation rubber 30B is shaped to cover the NAND flash memory chips 24A and 24B. As illustrated in FIG. 6, the heat dissipation rubber 30B has a stop hole 33 that is open on one side surface and closed on the other side surface. The stop hole 33 is an example of a recess. By inserting the base end side of the SSD module 20 into the stop hole 33 of the heat dissipation rubber 30B, the heat dissipation rubber 30B can be located at a position to cover the NAND flash memory chips 24A and 24B.

A surface that forms part of an external surface of the heat dissipation rubber 30B is fixed to the mother board 10 via an adhesive 50. The adhesive 50 is, for example, a thermally conductive adhesive to which metal, ceramic, or the like having high thermal conductivity is added. Furthermore, the adhesive 50 contacts the ground 13B of the mother board 10.

In this way, in the electronic apparatus 1A, the SSD module 20 is fixed to the mother board 10 using not the screw 40 but the elastic heat dissipation rubber 30B. At this time, the heat dissipation rubber 30B is in thermal contact with the ground 13B of the mother board 10 via the adhesive 50 that is the thermally conductive adhesive. It is thereby possible to reduce damage to the peripheral components, such as the NAND flash memory chip 24B, of the screw clamp 26 and provide a heat dissipation path.

Moreover, in the electronic apparatus 1A, the SSD module 20 is fixed to the mother board 10 using not the screw 40 but the elastic heat dissipation rubber 30B. Therefore, it is possible to improve a vibration resistance, an impact resistance, and the like of the electronic apparatus 1A.

Figure 9:
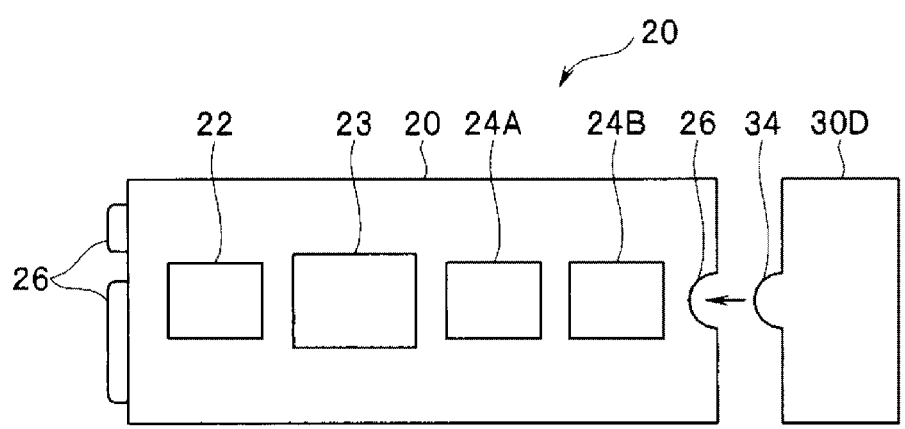
FIG. 9 is a plan view diagram illustrating a configuration of an SSD module and a heat dissipation rubber in the second modification of the second embodiment.

While the heat dissipation rubber 30B is shaped and/or located to cover the NAND flash memory chips 24A and 24B, a shape and/or a location of the heat dissipation rubber 30B is not limited to this one. For example, the heat dissipation rubber 30B may be shaped and/or located to cover only the NAND flash memory chip 24B. Alternatively, the heat dissipation rubber 30B may be shaped and/or located to cover not only the NAND flash memory chips 24A and 24B but also either the SSD controller 23 or the DRAM 22 and the SSD controller 23. In another alternative, the heat dissipation rubber 30B may be shaped and located as illustrated in FIGS. 7, 8, and 9.

First Modification

FIG. 7 is a side view diagram illustrating an example of a configuration of an electronic apparatus according to a first modification of the second embodiment. In FIG. 7, the same configurations as those in FIG. 5 are denoted by the same reference signs and not described repeatedly.

As illustrated in FIG. 7, an electronic apparatus 1B according to the first modification of the second embodiment uses a heat dissipation rubber 30C as an alternative to the heat dissipation rubber 30B used in the second embodiment. The heat dissipation rubber 30C is shaped not to cover the NAND flash memory chips 24A and 24B and to cover only part of the substrate 21 of the SSD module 20. That is, the heat dissipation rubber 30C accommodates part of the substrate 21, which is a region not including a region where the electronic components such as the DRAM 22, the SSD controller 23, and the NAND flash memory chips 24A and 24B are mounted. The heat dissipation rubber 30C is fixed to the mother board 10 via the adhesive 50 that is the thermally conductive adhesive.

With the configurations described above, in the electronic apparatus 1B, the heat generated by the DRAM 22, the SSD controller 23, and the NAND flash memory chips 24A and 24B dissipates to the mother board 10 via the substrate 21, the heat dissipation rubber 30C, and the adhesive 50. Furthermore, it is possible to increase a degree of freedom of other heat dissipation structures for the DRAM 22, the SSD controller 23, the NAND flash memory chips 24A and 24B, and the like.

Second Modification

FIG. 8 is a side view diagram illustrating an example of a configuration of an electronic apparatus according to a second modification of the second embodiment. FIG. 9 is a plan view diagram illustrating a configuration of an SSD module and a heat dissipation rubber in the second modification of the second embodiment. In FIG. 8, the same configurations as those in FIG. 5 are denoted by the same reference signs and not described repeatedly.

As illustrated in FIG. 8, an electronic apparatus 1C according to the second modification of the second embodiment uses a heat dissipation rubber 30D as an alternative to the heat dissipation rubber 30B used in the second embodiment. The heat dissipation rubber 30D is disposed in an end portion closer to the base end side of the substrate 21 and fixed to the mother board 10 via the adhesive 50.

As illustrated in FIG. 9, the heat dissipation rubber 30D has a projection 34 (may be referred to as a protrusion) of a semicircular shape that generally matches a shape of the screw clamp 26. A diameter with respect to an external shape of the projection 34 may be set slightly larger than a diameter with respect to the shape of the screw clamp 26. By fitting the projection 34 of the heat dissipation rubber 30D into the screw clamp 26 provided on the base end side of the substrate 21 and fixing the heat dissipation rubber 30D to the mother board 10 with the adhesive 50, it is possible to fix the SSD module 20 to the mother board 10.

With the configurations described above, in the electronic apparatus 1C, the heat generated by the DRAM 22, the SSD controller 23, and the NAND flash memory chips 24A and 24B dissipates to the mother board 10 via the substrate 21, the heat dissipation rubber 30D, and the adhesive 50. Furthermore, it is possible to increase a degree of freedom of other heat dissipation structures for the DRAM 22, the SSD controller 23, the NAND flash memory chips 24A and 24B, and the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An electronic apparatus comprising: a first substrate having a first surface on which a metal member is provided; a second substrate coupled to the first substrate above the first surface and on which a plurality of electronic components are mounted, the second substrate having a second surface that extends along the first surface and faces away from the first surface, the plurality of electronic components being disposed on the second surface and including one or more memory chips and a controller chip configured to control the one or more memory chips; and an elastic member having a through-hole that extends in a first direction along the second surface and through which the second substrate extends in the first direction, the elastic member having, in the through-hole, an inner surface that contacts the second surface or at least one of the plurality of the electronic components, and having an outer surface that faces the first surface and is in thermal contact with the metal member.

2. The electronic apparatus according to claim 1, wherein the elastic member includes a slit extending between an external surface of the elastic member and the through-hole.

3. The electronic apparatus according to claim 2, wherein the slit faces a side edge of the second substrate.

4. The electronic apparatus according to claim 1, wherein the metal member is a ground of an interconnection in the first substrate.

5. The electronic apparatus according to claim 1, wherein the outer surface of the elastic member is in direct contact with the metal member.

6. The electronic apparatus according to claim 1, wherein the outer surface of the elastic member is in contact with the metal member via a thermally conductive adhesive.

7. The electronic apparatus according to claim 1, wherein the inner surface of the elastic member contacts the controller chip.

8. The electronic apparatus according to claim 7, wherein the first substrate includes a socket on the first surface, the second substrate includes a connector connected to the socket on a first end of the second substrate in the first direction, and the controller chip is provided between the connector and the one or more memory chips in the first direction.

9. The electronic apparatus according to claim 1, wherein the inner surface of the elastic member contacts at least one of the one or more memory chips.

10. The electronic apparatus according to claim 9, wherein
the first substrate includes a socket on the first surface,
the second substrate includes a connector connected to the socket on an end of the second substrate in the first direction, and
the controller chip is provided between the connector and the one or more memory chips in the first direction.

11. The electronic apparatus according to claim 1, wherein the inner surface of the elastic member contacts the second surface, and does not contact any of the electronic components.

12. The electronic apparatus according to claim 1, wherein
the first substrate includes a socket on the first surface,
the second substrate includes a connector connected to the socket on a first end of the second substrate in the first direction, and a notch on a second end of the second substrate opposite to the first end in the first direction.

13. An electronic apparatus comprising: a first substrate having a first surface on which a metal member is provided; a second substrate coupled to the first substrate above the first surface and on which a plurality of electronic components are mounted, the second substrate having a second surface that extends along the first surface and faces away from the first surface, the plurality of electronic components being disposed on the second surface and including one or more memory chips and a controller chip configured to control the one or more memory chips; and an elastic member having a through-hole that extends in a first direction along the second surface and through which the second substrate extends in the first direction, the elastic member having, in the through-hole, a side surface that contacts a side edge of the second substrate, and having a bottom surface that faces the first surface and is in thermal contact with the metal member.

14. The electronic apparatus according to claim 13, wherein
the second substrate includes a notch forming a part of the side edge.

15. The electronic apparatus according to claim 14, wherein
the first substrate includes a socket on the first surface, and
the second substrate includes a connector connected to the socket on a first end of the second substrate in the first direction, and the notch on a second end of the second substrate opposite to the first end in the first direction.

16. The electronic apparatus according to claim 13, wherein the metal member is a ground of an interconnection in the first substrate.

17. The electronic apparatus according to claim 13, wherein the bottom surface of the elastic member is in direct contact with the metal member.

18. The electronic apparatus according to claim 13, wherein the bottom surface of the elastic member is in contact with the metal member via a thermally conductive adhesive.

19. The electronic apparatus according to claim 1, wherein
the first substrate includes a socket on the first surface,
the second substrate includes a connector connected to the socket on a first end of the second substrate in the first direction, and a notch, at which the second substrate is fixed to the first substrate with a screw, on a second end of the second substrate opposite to the first end in the first direction, and
the elastic member is provided closer to the first end than to the second end in the first direction.

20. The electronic apparatus according to claim 13, wherein
the first substrate includes a socket on the first surface,
the second substrate includes a connector connected to the socket on a first end of the second substrate in the first direction, and a notch, at which the second substrate is fixed to the first substrate with a screw, on a second end of the second substrate opposite to the first end in the first direction, and
the elastic member is provided closer to the first end than to the second end in the first direction.

* * * * *